US012245422B2

(12) United States Patent
Qian

(10) Patent No.: US 12,245,422 B2
(45) Date of Patent: Mar. 4, 2025

(54) SEMICONDUCTOR DEVICE AND A METHOD MAKING THE SAME

(71) Applicant: ChangXin Memory Technologies, Inc., Hefei (CN)

(72) Inventor: Shibing Qian, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 247 days.

(21) Appl. No.: 17/830,159

(22) Filed: Jun. 1, 2022

(65) Prior Publication Data

US 2023/0061462 A1 Mar. 2, 2023

(30) Foreign Application Priority Data

Aug. 24, 2021 (CN) .......................... 202110975447.0

(51) Int. Cl.
H10B 12/00 (2023.01)
(52) U.S. Cl.
CPC ......... H10B 12/485 (2023.02); H10B 12/053 (2023.02); H10B 12/34 (2023.02)
(58) Field of Classification Search
CPC .................................................. H10B 12/485
See application file for complete search history.

(56) References Cited

U.S. PATENT DOCUMENTS

| 6,383,878 B1* | 5/2002 | Huang | H10B 12/485 |
| | | | 438/299 |
| 2013/0119462 A1* | 5/2013 | Kye | H10B 12/485 |
| | | | 257/331 |
| 2023/0345703 A1* | 10/2023 | Yen | H10B 12/485 |

FOREIGN PATENT DOCUMENTS

CN 112582414 A 3/2021

* cited by examiner

*Primary Examiner* — Peter M Albrecht
(74) *Attorney, Agent, or Firm* — Syncoda LLC; Feng Ma

(57) ABSTRACT

Embodiments of the present application provide a semiconductor structure and a method for manufacturing the same. The semiconductor structure includes: a substrate, with word lines arranged at intervals in the substrate, and trenches between adjacent word lines; a bit line contact layer, wherein the bottom surface of the bit line contact layer is in contact with the bottom surface of the trench, and the bit line contact layer has a non-planar contact portion in the direction away from the bottom surface of the trench; the conductive layer is in contact with the non-planar contact portion of the bit line contact layer. The embodiments of the present application are beneficial in reducing the resistance of the bit line itself including the bit line contact layer and the conductive layer, thereby helping to improve the electrical performance of the semiconductor structure.

15 Claims, 22 Drawing Sheets

SEMICONDUCTOR DEVICE AND A METHOD MAKING THE SAME

TECHNICAL FIELD

The present application relates to the field of semiconductors, and in particular, to a semiconductor structure and a method for manufacturing the same.

BACKGROUND

Dynamic random access memory (DRAM) is a type of semiconductor memories commonly used in computers, DRAM is composed of many repeated memory cell devices. DRAM is usually arranged as two-dimensional matrixes of storage units containing a storage capacitor and a transistor, while the gate of the transistor is connected to the word line to control the turn-on or turn-off of the transistor, and the source and drain terminals of the transistor are respectively connected to The bit line and the storage capacitor, and data is read or stored in the storage capacitor through the bit line.

However, at present, a bit line usually includes stacked up bit line contact layer and a conductive layer. With the higher integration level of DRAMs, the physical dimensions of the bit line are further reduced, and the contact area between the bit line contact layer and the conductive layer is further reduced, resulting in an increase in the contact resistance between the bit line contact layer and the conductive layer, and a decrease in the conductivity of the bit line itself, thereby affecting the electrical performance and access speed of the DRAM.

Therefore, how to increase the conductivity of the bit line itself to improve the electrical performance of the DRAM is a technical problem that needs to be solved urgently at the present time.

SUMMARY

Embodiments of the present application provide a semiconductor structure and a method for manufacturing the same. They are at least beneficial in reducing the resistance of the bit line contact layer and the conductive layer of the bit lines, thereby helping to improve the electrical performance of the semiconductor structure.

According to one embodiment of the present application, a semiconductor structure is provided, comprising: a substrate, word lines arranged at intervals on the substrate, and trenches formed between adjacent word lines; a bit line contact layer, wherein the bottom surface of the bit line contact layer is in contact with the bottom surfaces of the trenches, wherein the bit line contact layer has a non-planar contact portion in a direction away from the bottom surfaces of the trenches; and a conductive layer, wherein the conductive layer is connected to the non-planar contact portion of the bit line contact layer.

According to some embodiments of the present application, another embodiment of the present application further provides a method for fabricating a semiconductor structure, including: providing a substrate with word lines arranged at intervals in the substrate; and forming trenches each between two adjacent word lines in the substrate; forming a bit line contact layer, the bottom surface of the bit line contact layer is in contact with the bottom surfaces of the trenches, and the bit line contact layer has a non-planar contact portion for this contact in a direction away from the bottom surfaces of the trenches; forming a conductive layer, and the conductive layer is in contact connection with the non-planar contact portion of the bit line contact layer.

The technical solutions provided by the embodiments of the present application have at least the following advantages:

Since the bit line contact layer has a non-planar contact portion in the direction away from the bottom surfaces of the trenches, the conductive layer is in contact with the non-planar contact portion. On the one hand, the conductive layer and the bit line contact layer are in a tight contact connection, and the contacting part between the bit line contact layer and the conductive layer is no longer a plane, but is composed of multiple surfaces with different orientations. In the plane where the bit line contact layer points to the direction of the conductive layer, ensure that the cross-sectional area of the bit line contact layer and the conductive layer on this plane is small (that is, the physical size of the bit line including the bit line contact layer and the conductive layer is relatively small. At the same time, it is beneficial to increase the contact area between the bit line contact layer and the conductive layer, thereby reducing the resistance from the bit line contact layer and the conductive layer, and the bit line itself. On the other hand, the conductivity of the bit line contact layer is usually lower than that of the conductive layer. When the bit line contact layer has a non-planar contact portion and the conductive layer is integrated in the non-planar contact portion, it is beneficial to reduce the ratio of the bit line contact layer in the bit lines, thereby helping to improve the overall conductivity of the bit lines. The above two aspects are both beneficial to reduce the resistance of the bit lines, thereby helping to improve the electrical performance of the semiconductor structure, so as to improve the access speed of the semiconductor structure. In addition, the second protrusions are intertwined in the grooves, is also beneficial in improving the stability of the connection between the bit line contact layer and the conductive layer.

BRIEF DESCRIPTION OF THE DRAWINGS

One or more embodiments are exemplified by the corresponding accompanying drawings, and these exemplary descriptions do not constitute limitations on the embodiments, and unless otherwise specified, the accompanying drawings do not constitute a scale limitation.

DETAILED DESCRIPTION OF THE PREFERRED EMBODIMENTS

It can be known from the background that the conductivity of the bit lines and the electrical performance of the semiconductor structure need to be improved.

The bit lines usually include a bit line contact layer and a conductive layer arranged in a stack. With the improvement of the integration degree of DRAM, the physical size of the bit lines is further reduced. As the area is reduced, the contact resistance between the bit line contact layer and the conductive layer is increased, and the conductivity of the bit line itself is decreased; further, the contact area between the bit line contact layer and the substrate is also reduced, resulting in increased contact resistance between the line and the substrate; at the same time, the conductivity of the bit line contact layer is usually lower than that of the conductive layer. Thus, the greater ratio the bit line contact layer is in the bit lines, the higher overall resistance of the bit lines will be.

The present application provides a semiconductor structure and a method for manufacturing the same. In the semiconductor structure, since there is a non-planar contact portion in a direction away from the bottom surface of the trench, the conductive layer is in contact with the non-planar contact portion, that is, the conductive layer and the bit line contact layer. On the one hand, in the plane perpendicular to the direction of the bit line contact layer pointing to the conductive layer, while ensuring that the cross-sectional area of the bit line contact layer and the conductive layer on this plane is small, it is beneficial to increase the contact area between the bit line contact layer and the conductive layer, thereby reducing the resistance of the bit line itself including the bit line contact layer and the conductive layer; the bigger area proportion of the bit line contact layer in the total bit lines is beneficial to improving the overall conductivity of the bit lines. The above two aspects are beneficial in reducing the resistance of the bit lines, thereby helping to improve the electrical performance of the semiconductor structure, and to improve the access speed of the semiconductor structures. In addition, the second protrusion is intertwined with the grooves, also is beneficial to contribute to the stability of the connection between the bit line contact layer and the conductive layer.

The embodiments of the present application will be described in detail below with reference to the accompanying drawings. However, those of ordinary skill in the art can understand that, in each embodiment of the present application, many technical details are provided for the reader to better understand the present application. However, even without these technical details and various changes and modifications based on the following embodiments, the technical solutions claimed in the present application can be realized.

Figure 1:
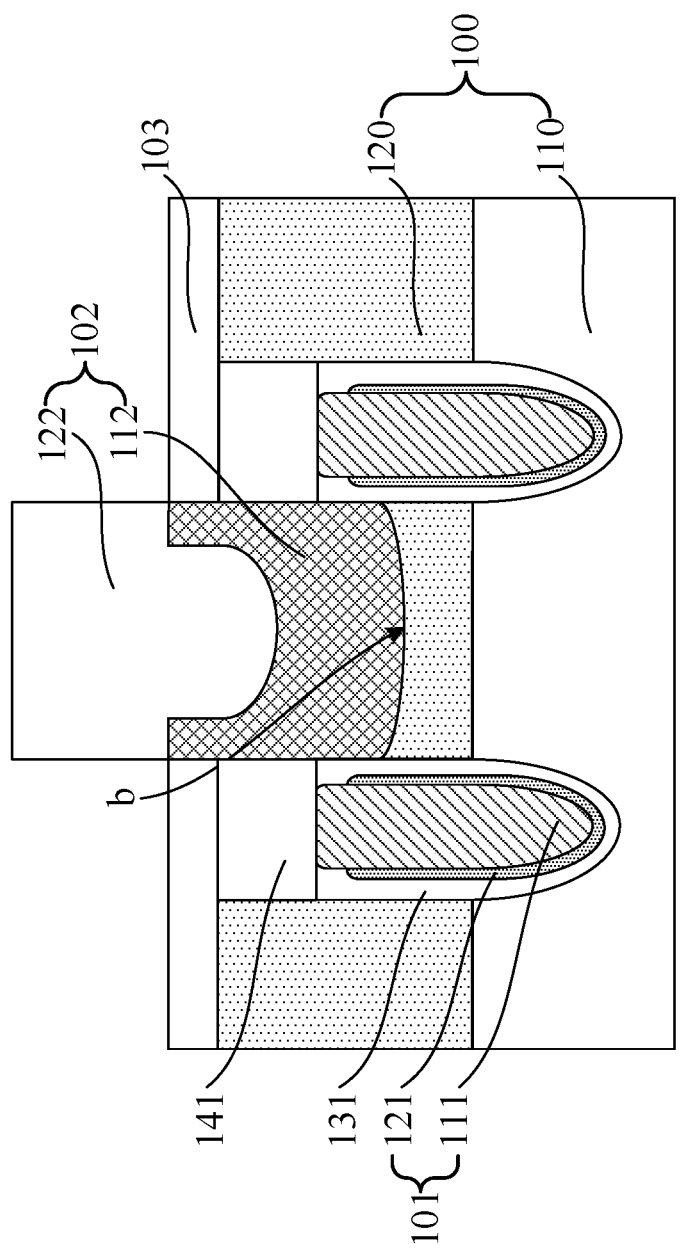
FIG. 1 is a schematic cross-sectional diagram of a semiconductor structure provided in an embodiment of the present application.
Figure 2:
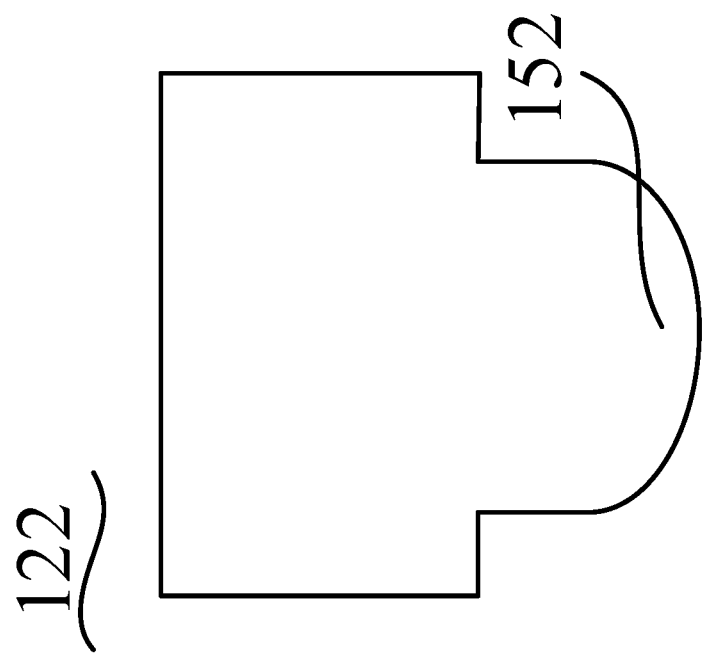
FIG. 2 is a schematic cross-sectional structural diagram of a conductive layer in the semiconductor structure shown in FIG. 1.
Figure 3:
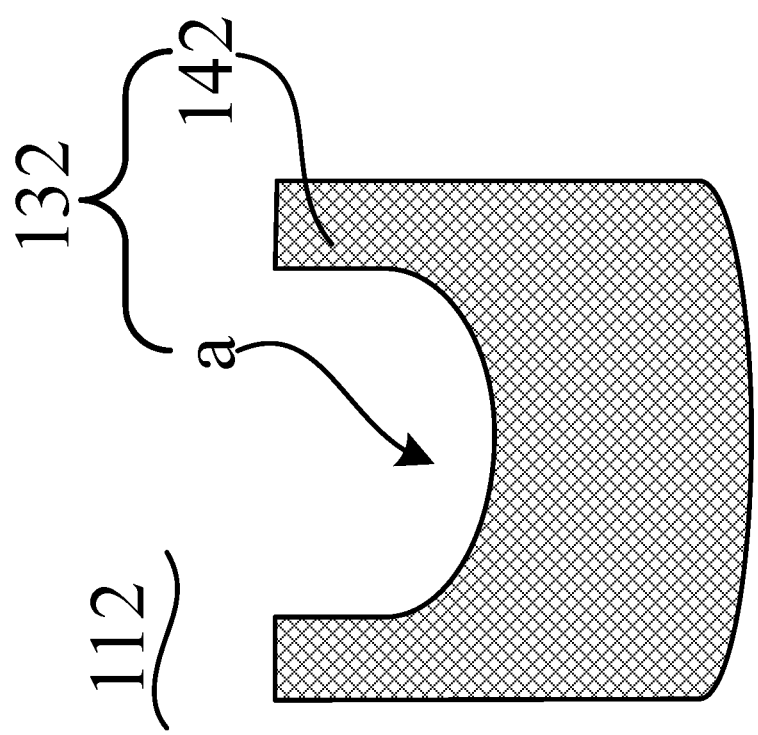
FIG. 3 is a schematic cross-sectional structural diagram of a bit line contact layer in the semiconductor structure shown in FIG. 1.

Referring to FIG. 1 to FIG. 3, FIG. 2 is a schematic cross-sectional structural diagram of a conductive layer in the semiconductor structure in FIG. 1. FIG. 3 is a schematic cross-sectional structural diagram of a bit line contact layer in the semiconductor structure shown in FIG. 1.

The semiconductor structure includes: a substrate 100 with word lines 101 arranged at intervals in the substrate 100, and a trench between adjacent word lines 101; a bit line contact layer 112, the bottom surface of the bit line contact layer 112 is in contact with the bottom surface b of the trench, and the bit line contact layer 112 has a non-planar contact portion 132 in the direction away from the bottom surface b of the trench.

Wherein, the substrate 100 may include but not limited to a single crystal silicon substrate, a polycrystalline silicon substrate, a gallium nitride substrate or a sapphire substrate. In addition, when the substrate 100 is a single crystal substrate or a polycrystalline substrate, it may also be an intrinsic silicon or a doped silicon substrate, further, an N-type polysilicon substrate or a P-type polysilicon substrate.

In some embodiments, the substrate 100 is doped, doped regions 120 and undoped regions 110 are formed on the substrate 100, and the word lines 101 pass through the doped regions 120. The doping ions may be phosphorous (P) ions, arsenic (As) ions, or boron (B) ions, or the like. In other embodiments, the substrate may also be doped in all regions.

In some embodiments, the word lines 101 include a metal layer 111 and a diffusion barrier layer 121, and the diffusion barrier layer 121 is located in most of the peripheral regions of the metal layer 111, which is beneficial to prevent the metal material in the metal layer 111 from diffusing into the adjacent structures of the word lines 101. In addition, the top surfaces of the word lines 101 are covered with a gate insulating layer 141, and the other periphery of the word lines 101 is surrounded by the gate oxide layer 131. The diffusion barrier layer 121 can be used as an adhesive to attach the metal layer 111 and the gate oxide layer 131 better, and the gate oxide layer 131 and the gate insulating layer 141 are jointly used to achieve insulation between the word lines 101 and other structures in the substrate 100. The material of the metal layer 111 may be at least one of metal materials such as tungsten, aluminum, copper or titanium, the material of the diffusion barrier layer 121 may be titanium nitride. The materials of the gate oxide layer 131 and the gate insulating layer 141 can be materials at least one of insulating materials such as silicon oxide, silicon nitride or silicon oxynitride.

In some embodiments, both the bit line contact layer 112 and the conductive layer 122 are integral parts of the bit lines 102. The material of the bit line contact layer 112 may be polysilicon, and the material of the conductive layer 122 may be at least one of metal materials such as tungsten, aluminum, copper, or titanium.

In some embodiments, the non-planar contact portion 132 of the bit line contact layer 112 has a first protrusion 142 and at least one groove surrounded by the first protrusion 142, and the conductive layer 122 is at a position corresponding to the groove a. There is a second protrusion 152 (see FIG. 2), and the second protrusion 152 is intertwined in the groove a.

Since the second protrusion 152 is intertwined in the groove a, on the one hand, the bottom surface and the side surface of the groove a are in contact with the second protrusion 152, which increases the contact area between the bit line contact layer 112 and the conductive layer 122. On the premise of ensuring that the bit lines 102 have a smaller structure dimension, it is beneficial to reduce the resistance of the bit lines 102 itself; on the other hand, the bit line contact layer 112 has a groove a, and the second protrusion 152 of the conductive layer 122 fills the groove a, which is beneficial to reduce the proportion of the bit line contact layer 112 in the bit lines 102, thereby improving the overall conductivity of the bit lines 102. The above two aspects are beneficial in reducing the resistance of the bit lines 102 by itself, thereby helping to improve the electrical performance of the semiconductor structure, and to improve the access speed of the semiconductor structure. In addition, the second protrusion 152 is intertwined in the groove a, which increases the total contact area between the bit line contact layer 112 and the conductive layer 122, thereby helping to increase the distance between the bit line contact layer 112 and the conductive layer 122. For example, the side surface of the groove a abuts the side surface of the second protrusion 152, which hinders the relative sliding between the bit line contact layer 112 and the conductive layer 122 in the direction perpendicular to the side surface of the guide groove a, therefore improve the stability of the relative connection between the bit line contact layer 112 and the conductive layer 122.

In some embodiments, the bottom surface of the conductive layer 122 is higher than the top surface of the word line 101, and the same conductive layer 122 is in contact with at least two non-planar contact portions 132.

It should be noted that, in general, the bit lines 102 are located above the word lines 101, and the extension direction of the bit lines 102 is different from the extension direction of the word lines 101. There is an insulating material between the bit lines 102 and the word lines 101 to realize isolation. In FIG. 1, as an example, the bottom surface of the bit line contact layer 112 closest to the bottom surfaces of the trenches is lower than the top surface of the word lines 101 adjacent to the conductive layer 122. When the conductive layer 122 is located above the word lines 101, the bit line contact layer 112 is only located in the trenches between adjacent word lines 101 to avoid the situation where the bit line contact layer 112 touches the word lines 101 along the extension direction of the conductive layer 122, wherein the extension direction of the conductive layer 122 is the same as the bit lines 102 extension direction. Therefore, the same conductive layer 122 is in contact with at least two non-planar contact portions 132 of the bit line contact layer 112, that is, the same bit line 102 includes one conductive layer 122 and at least two parts of the bit line contact layer 112.

In other embodiments, the bottom surface of the bit line contact layer closest to the bottom surfaces of the trenches can be not lower than the top surfaces of the word lines adjacent to the conductive layer, and the same conductive layer may be in contact with at least two top surfaces of the bit line contact layer. That is, the same bit line may also include one conductive layer and at least two bit line contact layers. In addition, when the bottom surface of the bit line contact layer closest to the bottom surfaces of the trenches is higher than the top surfaces of the word lines adjacent to the conductive layer, the bit line contact layer can be located not only in the trench between adjacent word lines, but also located above multiple word lines, the bit line contact layer and the conductive layer may have the same extension direction, that is, the same bit line may include a conductive layer and a bit line contact layer. In practical applications, the disclosure does not limit the relative height relationship between the bottom surface of the bit line contact layer closest to the bottom surfaces of the trenches and the top surface of the word line adjacent to the conductive layer.

In addition, it should be noted that in FIG. 1, the side surfaces of the trenches comprise gate oxide layers 131 as one example, but in practical applications, the side surfaces of the trenches may also be directly on the substrate.

The semiconductor structure may further includes: a protective layer 103 located on the surfaces of the substrate 100 and the gate oxide layer 131 to prevent the surface of the substrate 100 from being exposed. In some embodiments, the top surface of the first protrusion 142 away from the bottom surface b of the trench is flush with the top surface of the protective layer 103 away from the substrate 100. In other embodiments, the top surface of the first protrusion away from the bottom surface of the groove may also be flush with the surface of the substrate. It should be noted that, in practical applications, there is no limiting requirement regarding to the relative relationship between the top surface of the first protrusion away from the bottom surface of the groove and its adjacent structures. The material of the protective layer 103 may be at least one of insulating materials such as silicon oxide, silicon nitride, or silicon oxynitride.

In some embodiments, referring to FIGS. 4 to 8, there is one first protrusion 142, and the orthographic projection of the first protrusions 142 on the substrate 100 (refer to FIG. 1) is an axisymmetric figure.

Since the orthographic projection of the first protrusion 142 on the substrate 100 is an axisymmetric figure, the center axis of the first protrusion 142 can be coincident with the center axis of the cross section of the bit line 102 shown in FIG. 1. If the non-planar contact portions 132 of the bit line contact layer 112 are evenly distributed, the grooves a made by the first protrusions 142 are evenly distributed in the non-planar contact portions 132 of the bit line contact layer 112. In addition, the second protrusion 152 (refer to FIG. 2) and the grooves a are intertwined with each other, so the central axis of the second protrusion 152 also coincides with the central axis of the grooves a. Under the stress on the bit lines 102, there might be a relative sliding tendency between the bit line contact layer 112 and the conductive layer 122. The attaching force between the second protrusion 152 and the first protrusion 142 is evenly distributed on the first protrusion 142 and the second protrusion 152, preventing the deformation of the first protrusion 142 and the second protrusion 152, therefore improving the stability of the connection between the bit line contact layer 112 and the conductive layer 122.

The specific distribution of the first protrusions 142 and the grooves a in the non-planar contact portion 132 of the bit line contact layer 112 will be described below with reference to FIGS. 4 to 8, as examples of the embodiment the application. Schematic diagrams of five cross-sectional structures of the first protrusion 142 with the grooves a in the middle. It should be noted that, in order to help viewing the protruding the first protrusions 142 and the grooves a, the first protrusions 142 are filled with patterns.

Figure 4:
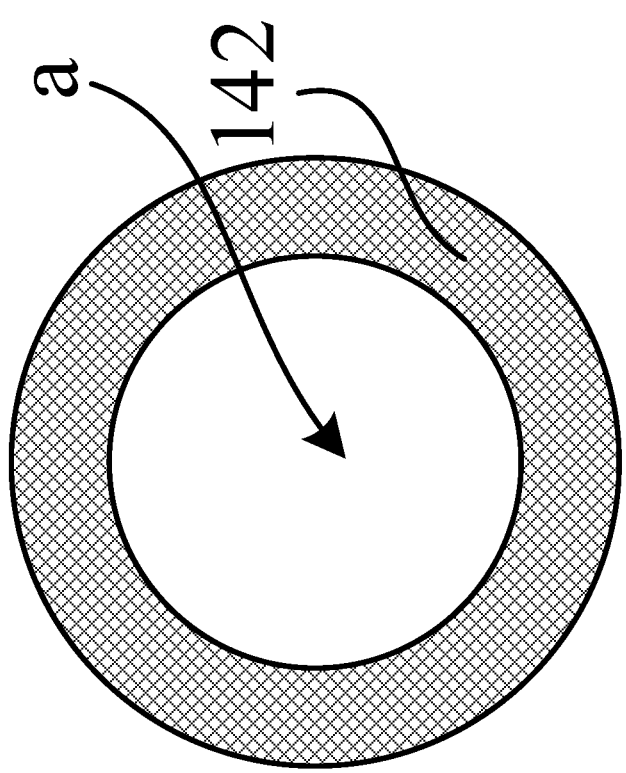
FIG. 4 to FIG. 12 show cross-sectional diagrams of nine patterns of the first protrusions and grooves in the semiconductor structure according to an embodiment of the present application.
Figure 5:
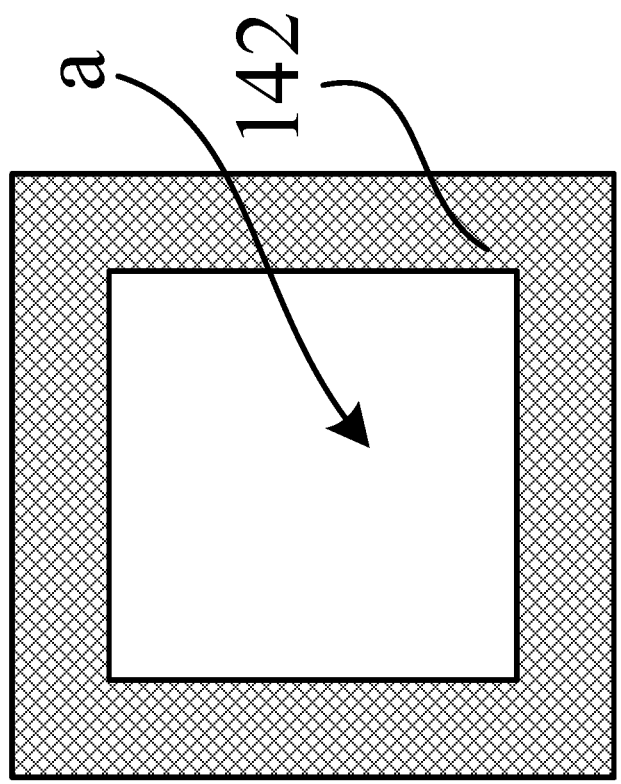

In some examples, referring to FIGS. 4 and 5, the orthographic projection of the first protrusion 142 on the substrate 100 (refer to FIG. 1) is annular in FIG. 4, the orthographic projection of the first protrusion 142 on the substrate 100 is a ring, and the orthographic projection of the groove a on the substrate 100 is a circle; or, referring to FIG. 5, the first protrusion 142 is in the orthographic projection of the substrate 100 is a rectangular ring, and the orthographic projection of the groove a on the substrate 100 is also a rectangle.

Figure 6:
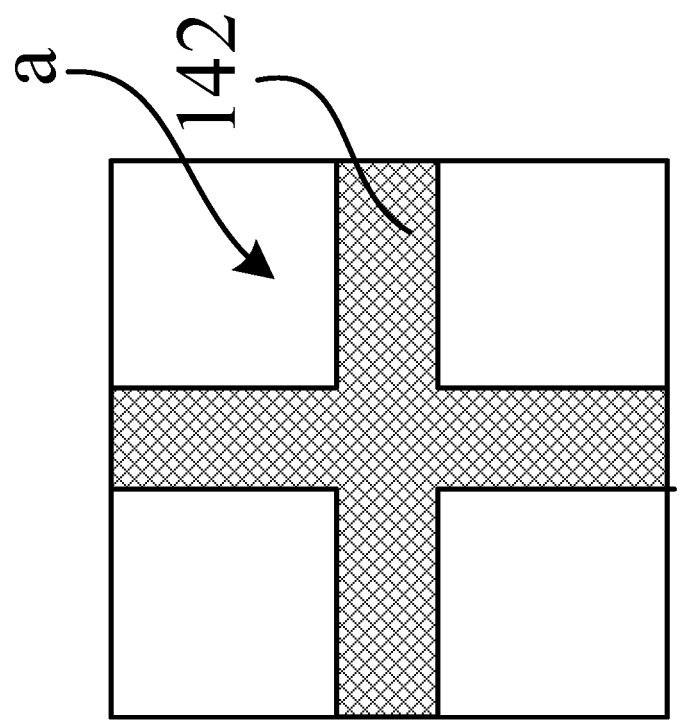

In other examples, referring to FIG. 6, the orthographic projection of the first protrusions 142 on the substrate 100 (refer to FIG. 1) is a cross, and the side surfaces of the trenches between the first protrusions 142 and the adjacent word lines 101 together form four grooves a.

Figure 7:
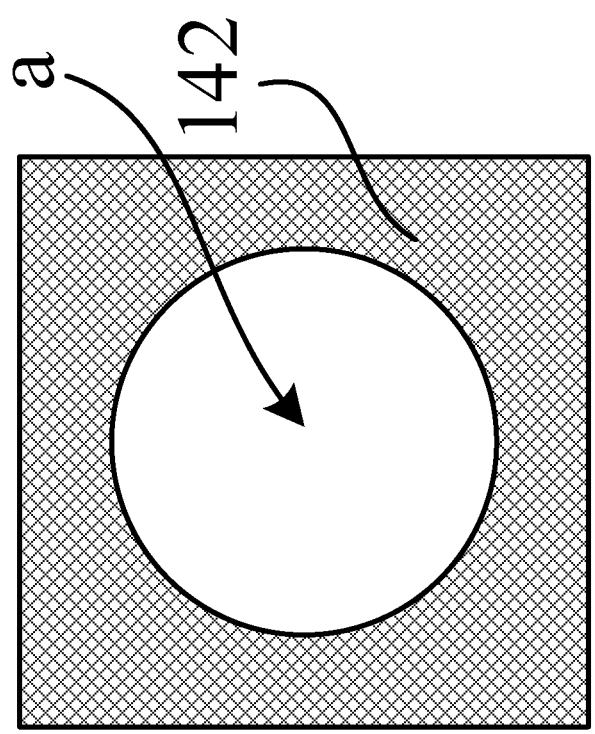

In still other examples, referring to FIG. 7, the figure enclosed by the orthographic projection of the outer edges of the first protrusion 142 on the base 100 (refer to FIG. 1) is a rectangle, and the orthographic projection of the groove a on the base 100 enclosed by the first protrusion 142 is a circle.

Figure 8:
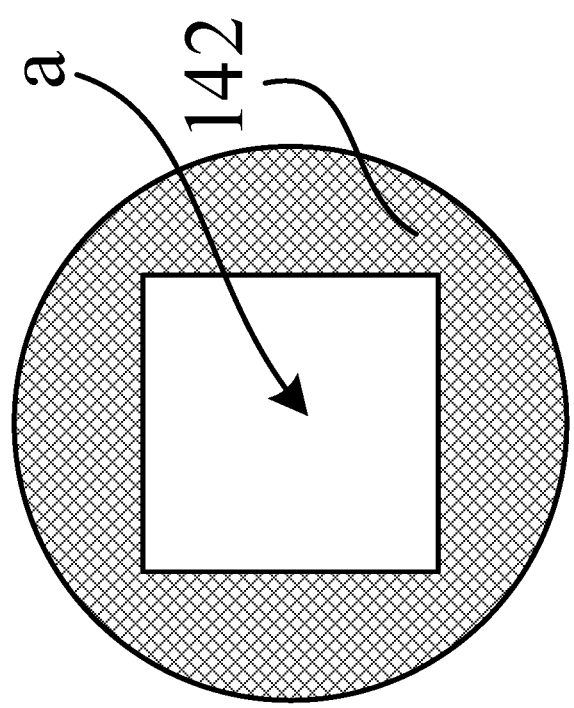

In still other examples, referring to FIG. 8, the figure enclosed by the orthographic projection of the outer edge of the first protrusion 142 on the substrate 100 (refer to FIG. 1)

is a circle, and the orthographic projection of the groove a on the substrate 100 has the shape of a rectangle.

It should be noted that, in practical applications, the embodiment of the present application does not limit the shape of the figure formed by the orthographic projection of the outer edge of the first protrusion on the base, and also does not limit shape of the groove formed by the first protrusion is on the base. In other embodiments, the orthographic projection of the first protrusion on the substrate may not be an axisymmetric figure. In addition, in the above example, the relative positions of the first protrusions and the grooves can be switched, as long as the second protrusions and the first protrusions in the conductive layer related to the grooves are intertwined with each other to form a bit line.

In other embodiments, referring to FIGS. 9 to 12, the number of the first protrusions 142 is at least two, and the combined structure is composed of the two first protrusions 142 which has positive axisymmetric figure projection on the substrate 100 (refer to FIG. 1). And the orthographic projection of the groove a on the substrate 100 is an axisymmetric figure.

Since the orthographic projection of the combined structure composed of at least two first protrusions 142 on the substrate 100 is an axisymmetric figure, it is beneficial to make the two first protrusions 142 evenly and symmetrically distributed in the non-planar contact portion 132 of the bit line contact layer 112, and the orthographic projection of the groove a surrounded by at least two first protrusions 142 on the substrate 100 is an axisymmetric figure, that is, the groove a is also evenly distributed in the non-planar contact portion 132 of the bit line contact layer 112. Therefore, the second protrusion 152 (refer to FIG. 2) and the groove a are intertwined with each other. When the bit line 102 is affected by the stress, and the bit line contact layer 112 and the conductive layer 122 tend to slide to each other relatively, the attaching force between the second protrusion 152 with the first protrusions 142 is evenly distributed on the first protrusions 142 and the second protrusions 152, preventing the deformation of the first protrusions 142 and the second protrusions 152, thereby improving the stability of the connection between the bit line contact layer 112 and the conductive layer 122.

The specific distribution of the at least two first protrusions 142 and the groove a in the non-planar contact portion 132 of the bit line contact layer 112 will be described below with reference to FIGS. 9 to 12, which are the schematic diagrams of other four cross-sectional structures of the first protrusion 142 and the groove a in an embodiment of present application. It should be noted that, in order to visualize the first protrusions 142 and the grooves a, only the first protrusions 142 are filled with patterns.

Figure 9:
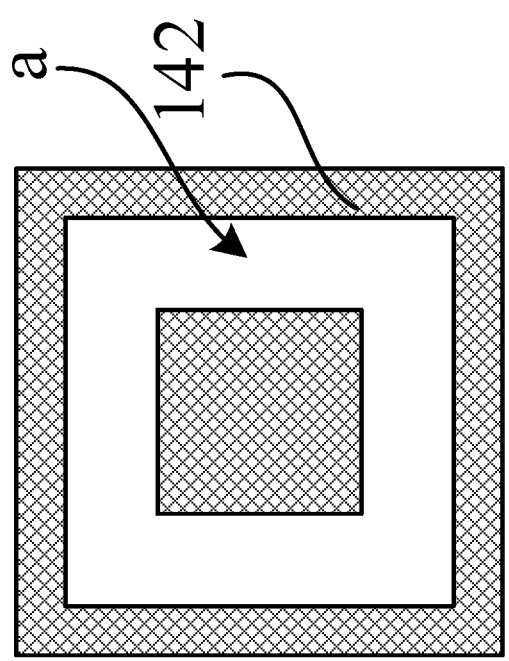
Figure 10:
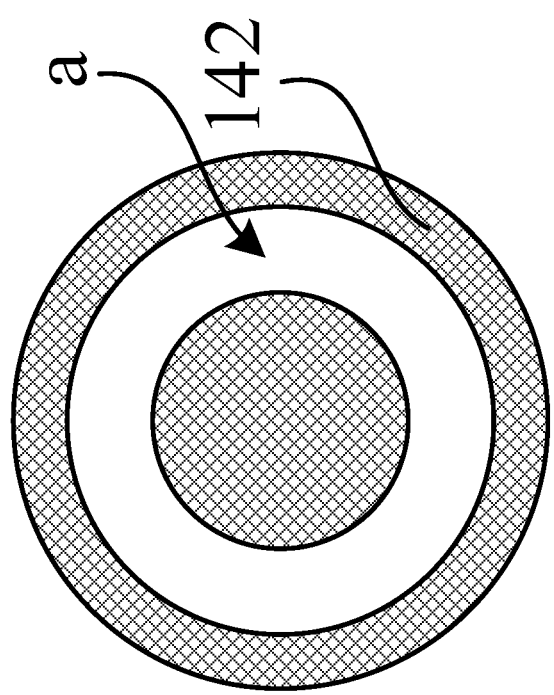

In some examples, referring to FIGS. 9 and 10, the non-planar contact portion 132 of the bit line contact layer 112 has two first protrusions 142, and the orthographic projection of the groove a on the substrate 100 is a ring or a cross. In FIG. 10, the orthographic projection of the first protrusion 142 at the outermost edge on the base 100 is a ring, the orthographic projection of the first protrusion 142 at the center on the base 100 is a circle, and the orthographic projection of the groove a on the base 100 is a circular ring; or, referring to FIG. 9, the orthographic projection of the first protrusion 142 at the outermost edge on the base 100 is a square ring, and the orthographic projection of the first protrusion 142 at the center on the base 100 is a rectangle. The orthographic projection of the groove a on the substrate 100 is a square ring.

Figure 11:
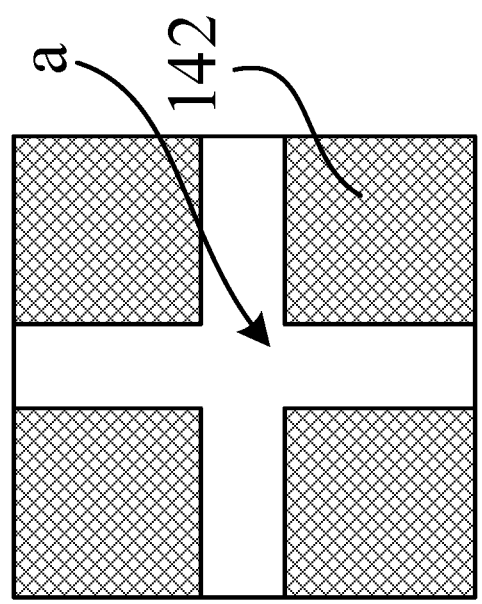

In other examples, referring to FIG. 11, the non-planar contact portion 132 of the bit line contact layer 112 has four first protrusions 142, and the orthographic projection on the substrate 100 of the groove a enclosed by the four first protrusions 142 is a cross.

Figure 12:
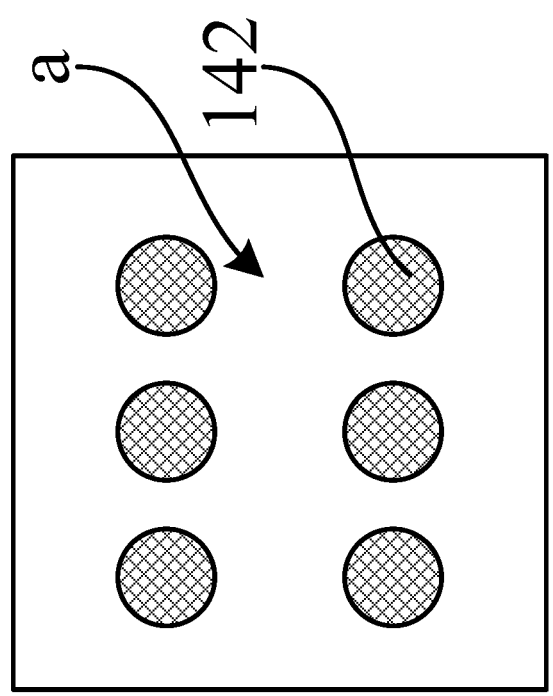

In still other examples, referring to FIG. 12, the non-planar contact portion 132 of the bit line contact layer 112 has six first protrusions 142, and the first protrusions 142 are arranged in an array. The first protrusions 142 and trenches form grooves a together. In FIG. 12, three first protrusions 142 are in a row, and six first protrusions 142 together form two rows. As an example, the orthographic projection of each first protrusion 142 on the substrate 100 is a circle. In a practical application, the number of rows and columns of the plurality of first protrusions, the number of first protrusions included in each row or each column, and the shape of the orthographic projection of the first protrusions on the substrate are not limited to the above description.

In addition, it should be noted that, in practical applications, the embodiments of the present application do not limit the shape of the orthographic projection of the combined structure composed of at least two first protrusions on the substrate. The shape of the orthographic projection of the grooves on the substrate is also not limited. In other embodiments, the orthographic projection of the combined structure composed of at least two first protrusions on the substrate may not be an axisymmetric figure. In addition, in the above example, the relative positions of the first protrusions and the grooves can be switched, as long as the second protrusions and the first protrusions in the conductive layer corresponding to the grooves are intertwined with each other to form a bit line.

Figure 13:
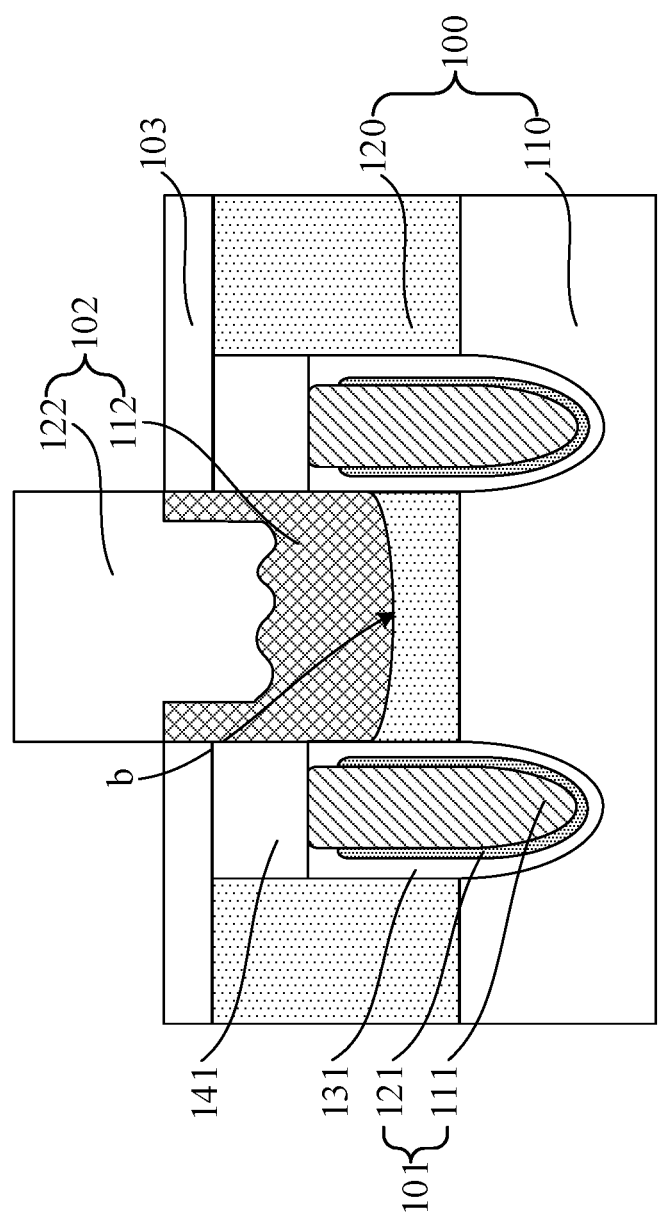
FIG. 13 to FIG. 18 show cross-sectional diagrams of six other structures of the semiconductor structure provided in an embodiment of the application.

In the above various embodiments, on the one hand, referring to FIG. 1 and FIG. 13, in the direction perpendicular to the surface of the substrate 100, the bottom surface of a single groove a may have at least two regions with different depths.

Since the bottom surface of a single groove a can have at least two regions with different depths, it is beneficial to further increase the total contact area where the second protrusion 152 (refer to FIG. 2) that is intertwined with the groove a is in contact with the groove a. On the one hand, it is beneficial to reduce the contact resistance between the bit line contact layer 112 and the conductive layer 122 in order to reduce the resistance of the bit line 102 itself, thereby improving the electrical performance and access speed of the semiconductor structure. The attaching force between the line contact layer 112 and the conductive layer 122 avoids relative sliding between the bit line contact layer 112 and the conductive layer 122, thereby improving the stability of the connection between the bit line contact layer 112 and the conductive layer 122.

Figure 14:
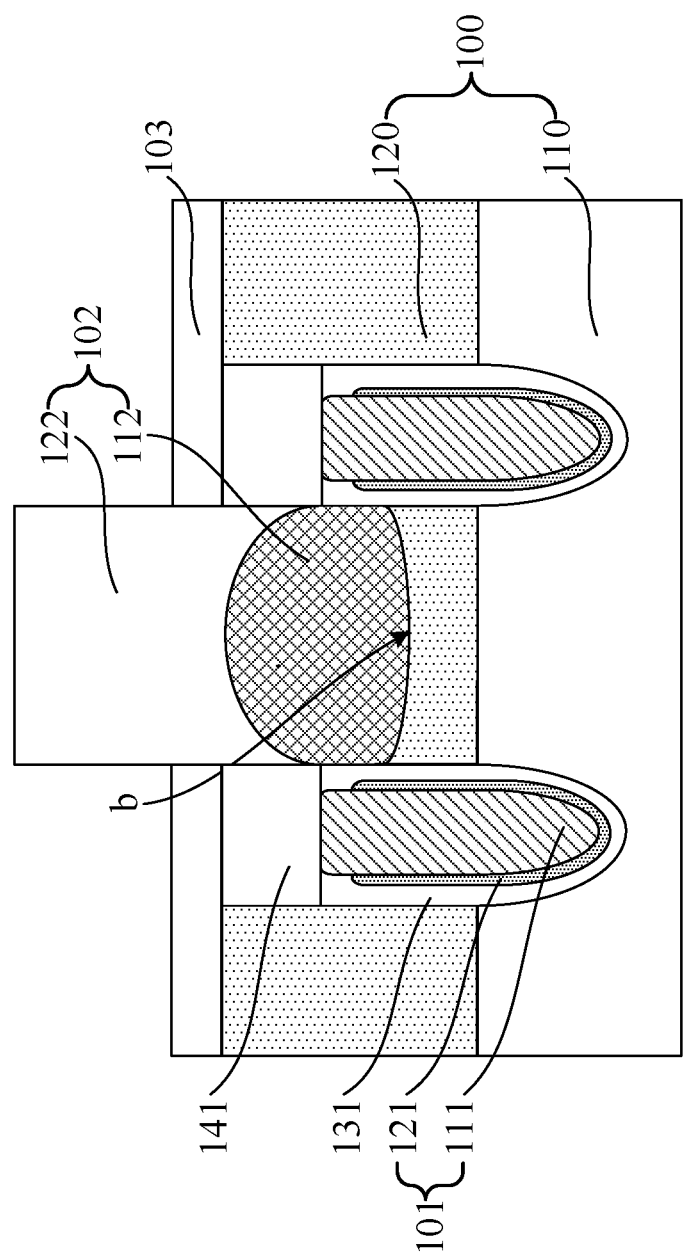

The specific shape of the bottom surface of a single groove a will be described below with reference to FIG. 1, FIG. 13 and FIG. 14. FIG. 1, FIG. 13 and FIG. 14 show the three cross-sectional views of the specific shapes in the bottom surfaces of the single groove type in an embodiment of the application.

In some examples, continue to refer to FIG. 1, the bottom surface of the groove a may be a concave surface recessed toward the substrate 100. In this way, it is beneficial to further reduce the volume of the bit line contact layer 112, thereby reducing the proportion of the bit line contact layer 112 in the bit line 102, so as to improve the conductivity of the bit line 102 itself, thereby helping to improve the electrical performance of the semiconductor structure. and access speed.

In other examples, referring to FIG. 13, the bottom surface of the groove a may be wavy. In this way, it is beneficial to further increase the total contact area where the second protrusion 152 (refer to FIG. 2) is intertwined with the groove a is in contact with the groove a, thereby reducing the contact area between the bit line contact layer 112 and the conductive layer 122, reducing the contact resistance of the bit line 102 itself, thereby improving the electrical performance and access speed of the semiconductor structure.

In still other embodiments, referring to FIG. 14, the non-planar contact portion 132 (refer to FIG. 3) is located in the trench, and the non-planar contact portion 132 has a convex surface that protrudes away from the bottom surface b of the trench. In this way, it is also beneficial to increase the total contact area where the bit line contact layer 112 is in contact with the conductive layer 122, thereby reducing the contact resistance between the bit line contact layer 112 and the conductive layer 122, thereby reducing the resistance of the bit line 102 itself, improving the electrical performance and access speed of semiconductor structures.

In other embodiments, the bottom surface of the groove may have be arranged to have the shape of stairs. Correspondingly, the second protrusions intertwined with the grooves are also stairs-like, this is beneficial in increasing the volume of the conductive layer and increasing the ratio of the conductive layer in the bit lines, thereby helping to reduce the resistance of the bit line itself, helping to improve the electrical performance and access speed of the semiconductor structure.

It should be noted that, with reference to FIG. 3, as an example, in FIG. 1, FIG. 13 and FIG. 14, in the direction perpendicular to the sidewalls of the trenches, the first protrusion 142 has a part of the same width at the end away from the substrate 100, but in practical applications, the width of the first protrusion may gradually decrease in the direction away from the substrate.

Figure 15:
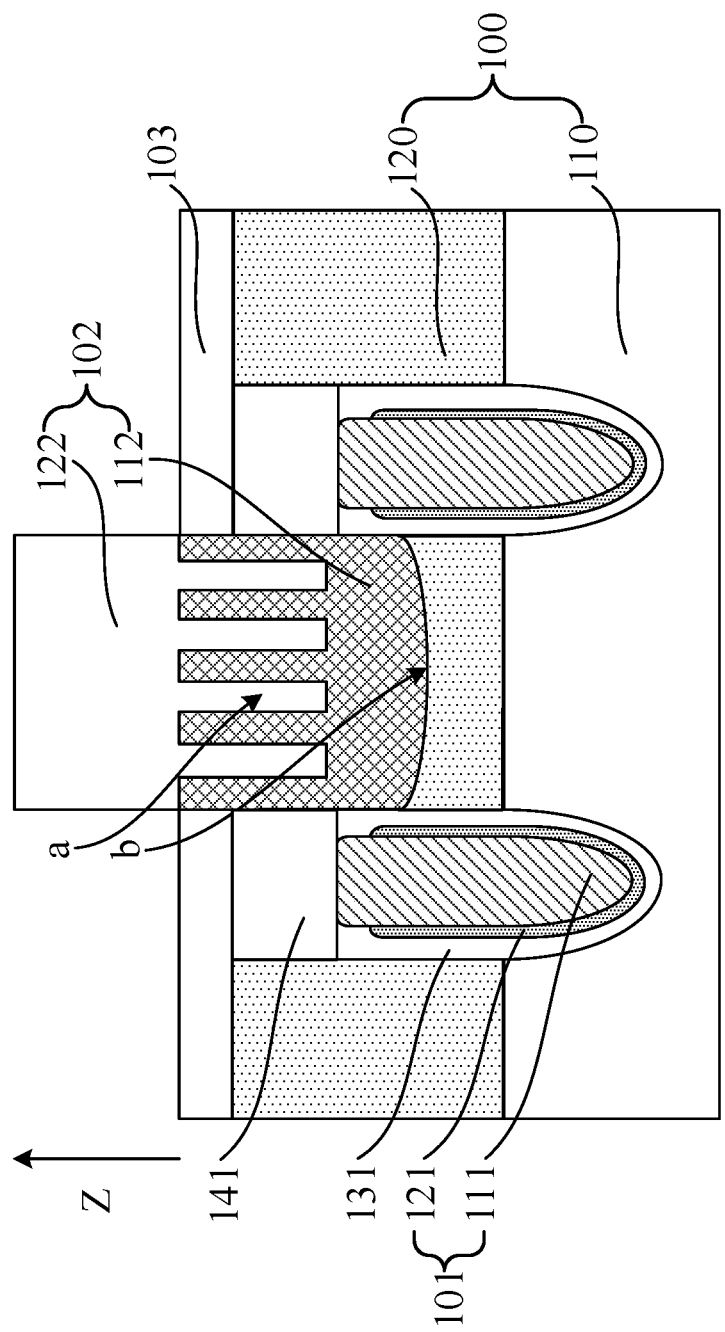
Figure 16:
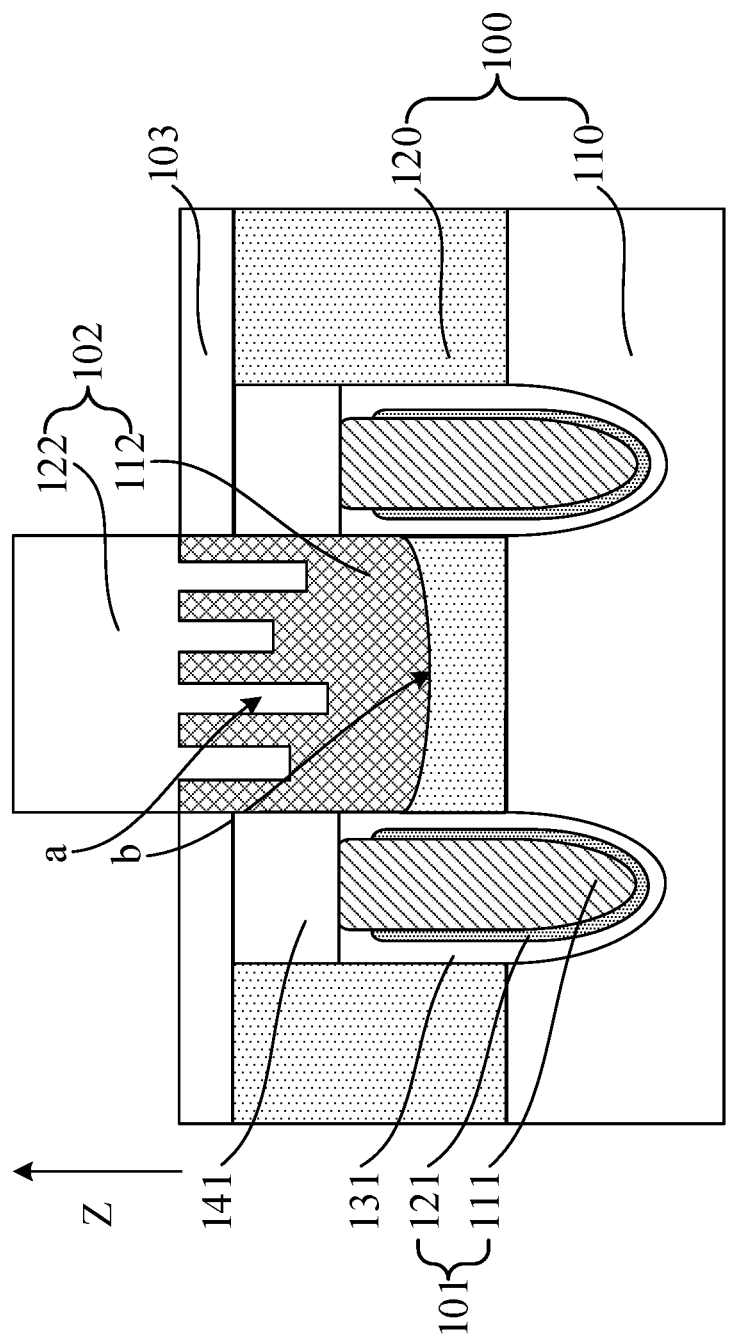

In the above various embodiments, on the other hand, referring to FIGS. 15 and 16, the non-planar contact portion 132 (refer to FIG. 3) may have at least two grooves a arranged at intervals. In this way, it is beneficial to further increase the attaching force between the bit line contact layer 112 and the conductive layer 122, avoid the relative sliding between the bit line contact layer 112 and the conductive layer 122, and thereby improve the stability of the connection relationship between the bit line contact layer 112 and the conductive layer 122.

The specific arrangement of the depths of the at least two grooves a will be described below with reference to FIG. 15 and FIG. 16. FIGS. 15 and 16 are the schematic diagram of the two cross-sectional structures of the specific arrangements of the depths of the at least two grooves a in an embodiment of the application.

In some examples, referring to FIG. 15, the non-planar contact portion 132 may have four grooves a arranged at intervals, and in the direction Z perpendicular to the surface of the substrate 100, the depths of each groove a are the same. It should be noted that FIG. 15 has four grooves a as an example. In practical applications, the number of grooves a is not limited, and the arrangement of multiple grooves a is not limited.

In other examples, referring to FIG. 16, the non-planar contact portion 132 may have four grooves a arranged at intervals, and in the direction Z perpendicular to the surface of the substrate 100, the depths of the grooves a are different. In practical applications, some grooves may have the same depth, and some grooves may have different depths.

Figure 17:
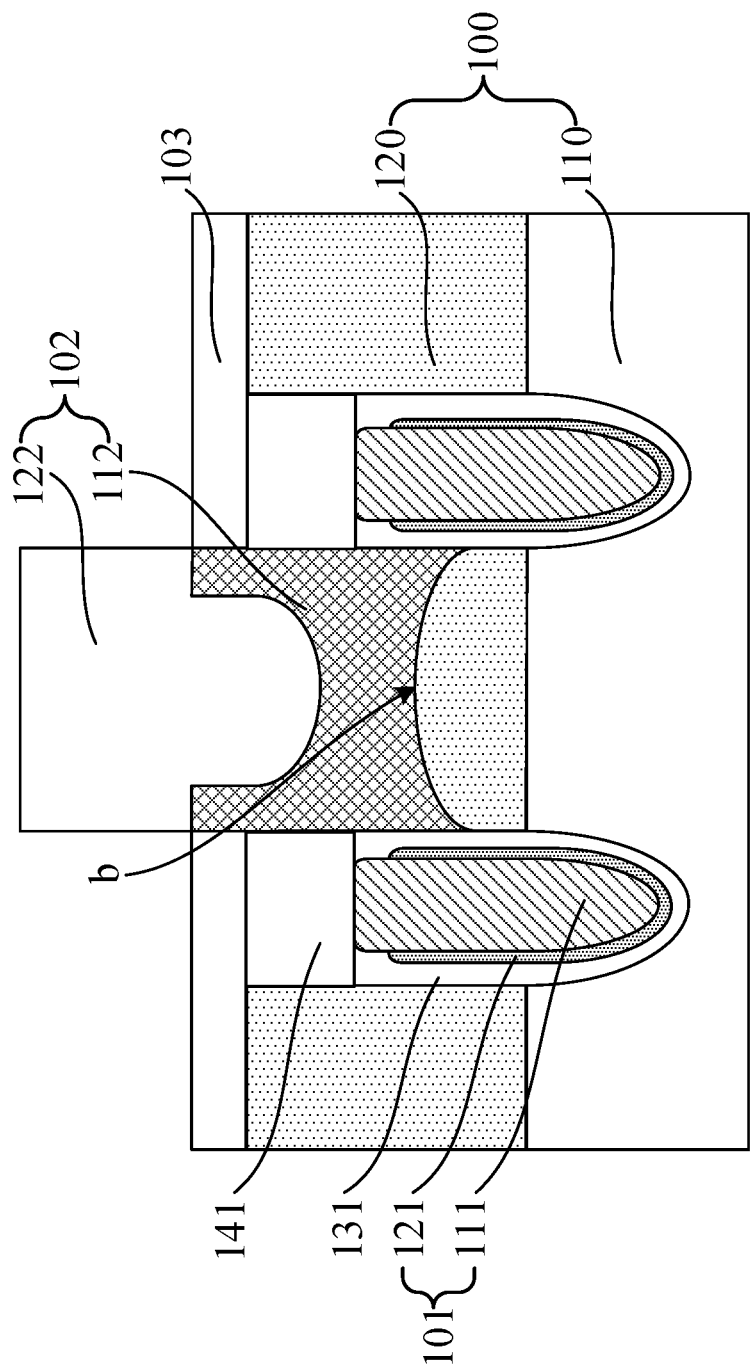
Figure 18:
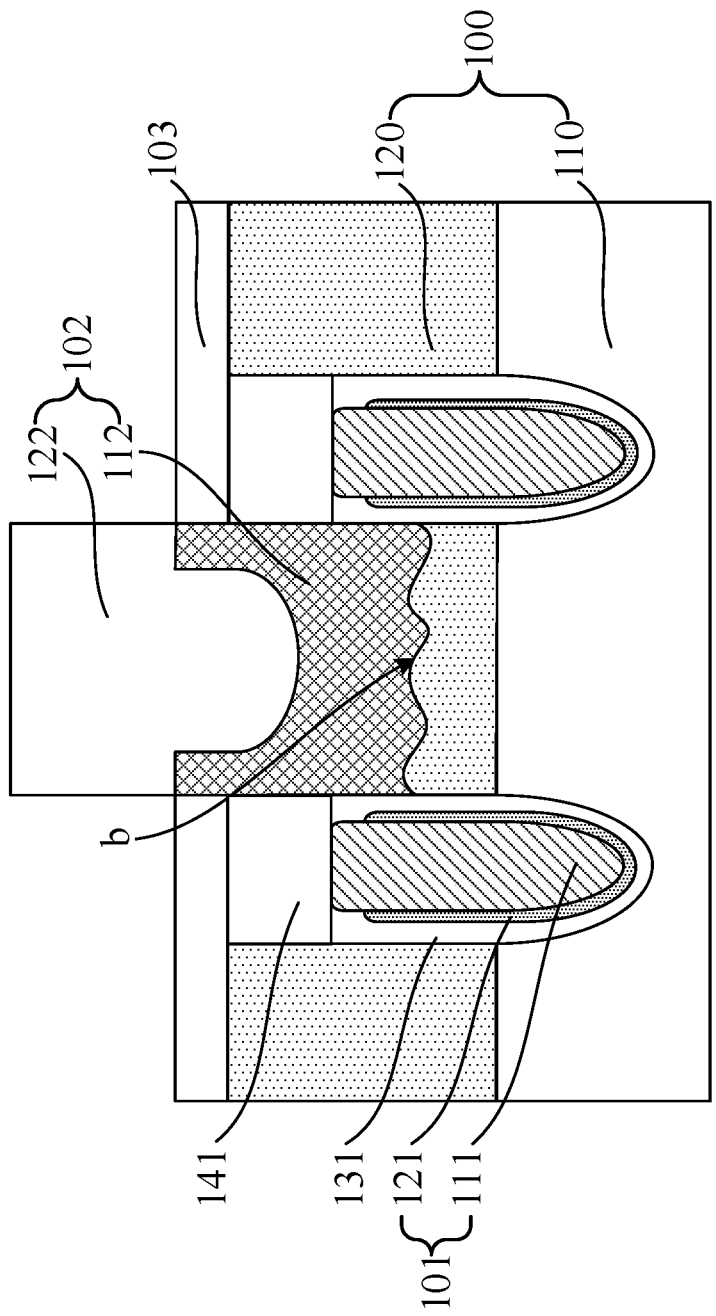

In addition, on the basis of the above embodiments, referring to FIGS. 17 and 18, in the direction perpendicular to the surface of the substrate 100, the bottom surface b of the trench may have at least two regions with different depths. In this way, it is beneficial to increase the contact area between the substrate 100 located under the bottom surface b of the trench and the bit line contact layer 112, so as to reduce the contact resistance between the bit line contact layer 112 and the substrate 100 located under the bottom surface b of the trench. Therefore, it is beneficial to improve the electrical performance and access speed of the semiconductor structure.

The specific shape of the groove bottom surface b will be described below with reference to FIG. 17 and FIG. 18.

In some examples, referring to FIG. 17, the trench bottom surface b may be a convex surface raised toward the bit line contact layer 112. Such a way is beneficial to further reduce the volume of the bit line contact layer 112, so as to further reduce the proportion of the bit line contact layer 112 in the bit line 102, so as to reduce the resistance of the bit line 102 itself, thereby improving the electrical performance and access speed of the semiconductor structure.

In other examples, referring to FIG. 18, the bottom surface b of the groove may be wavy. In other examples, the bottom surface of the groove can also has a stepped shape.

It should be noted that, in practical applications, the substrate under the bottom surface of the trench may have third protrusions, wherein the third protrusions are related to the second protrusions of the conductive layer, that is, various types of protrusions configured in the second protrusions may apply to the third protrusion. In addition, the bit line contact layer in contact with the bottom surface of the trench may have a fourth protrusion at the end, wherein the fourth protrusion are related to the first protrusion, that is, various shapes included in the first protrusion can be applied to the fourth protrusion.

To sum up, the second protrusion 152 is intertwined in the groove a. On the one hand, in the plane perpendicular to the direction of the bit line contact layer 112 to the conductive layer 122, it is ensured that the bit line contact layer 112 and the conductive layer 122 in the cross-sectional area on the plane is small, it is beneficial to increase the contact area between the bit line contact layer 112 and the conductive layer 122, thereby reducing the resistance of the bit line 102 itself; on the other hand, the bit line contact layer 112 forms a concave groove a, and the second protrusion 152 of the conductive layer 122 fills the groove a, this is beneficial to reduce the ratio of the bit line contact layer 112 in the bit line 102, thereby improving the overall conductivity of the bit line 102. The above two aspects are useful in reducing the resistance of the bit line 102 itself, thereby helping to improve the electrical performance of the semiconductor structure, so as to improve the access speed of the semiconductor structure. In addition, the second protrusion 152 is intertwined in the groove a, which is beneficial to improve the stability of the connection between the bit line contact layer 112 and the conductive layer 122.

Another embodiment of the present application further provides a method for fabricating a semiconductor structure, and the method can be used to fabricate the semiconductor structure provided in the above embodiment. The manufacturing method of the semiconductor structure provided by another embodiment of the present application will be described in detail below with reference to the accompanying drawings.

FIG. 19 to FIG. 22 are schematic cross-sectional structural diagrams corresponding to each step in a method for fabricating a semiconductor structure according to another embodiment of the present application.

Figure 19:
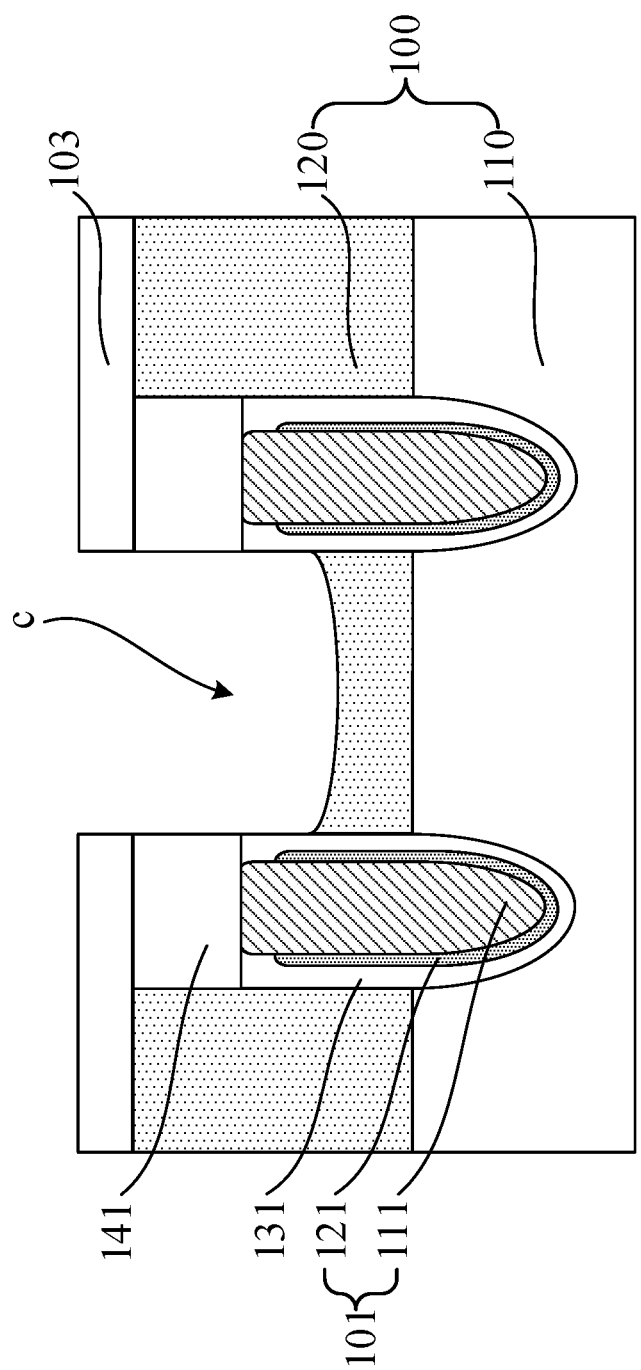
FIG. 19 to FIG. 22 are schematic cross-sectional structural diagrams corresponding to each step in a method for fabricating a semiconductor structure according to another embodiment of the present application.

Referring to FIG. 19 to FIG. 22, the method for fabricating a semiconductor structure includes the following process steps:

Referring to FIG. 19, providing a substrate 100, and forming a plurality of word lines 101 at intervals in the substrate 100; forming trenches c in the substrate 100 between adjacent word lines 101.

In some embodiments, the substrate 100 includes a doped region 120 and an undoped region 110; the word lines 101 includes a metal layer 111 and a diffusion barrier layer 121; the top surfaces of the word lines 101 are disposed with a gate insulating layer 141, the periphery areas of the word lines 101 are surrounded by the gate oxide layer 131; the bit line contact layer 112 and the conductive layer 122 are both components of the bit line 102 (FIG. 18); the protective layer 103 is formed on the surface above the doped region of the substrate and gate insulating layer 141. The relevant details of the above-mentioned various structures are the same as those of the foregoing embodiments, and are not repeated here.

It should be noted that, in FIG. 19, the substrate 100 can be etched to expose part of the sidewalls of the gate oxide layer 131 as an example (not shown). In practical applications, in the step of etching the substrate to form the trench, the sidewalls of the trench may also be the substrate.

In FIG. 3 and FIG. 20 to FIG. 22, a bit line contact layer 112 is formed, the bottom surface of the bit line contact layer 112 is in contact with the trench bottom surface b, and the bit line contact layer 112 has a non-planar contact portion 132 in a direction away from the trench bottom surface b.

Figure 20:
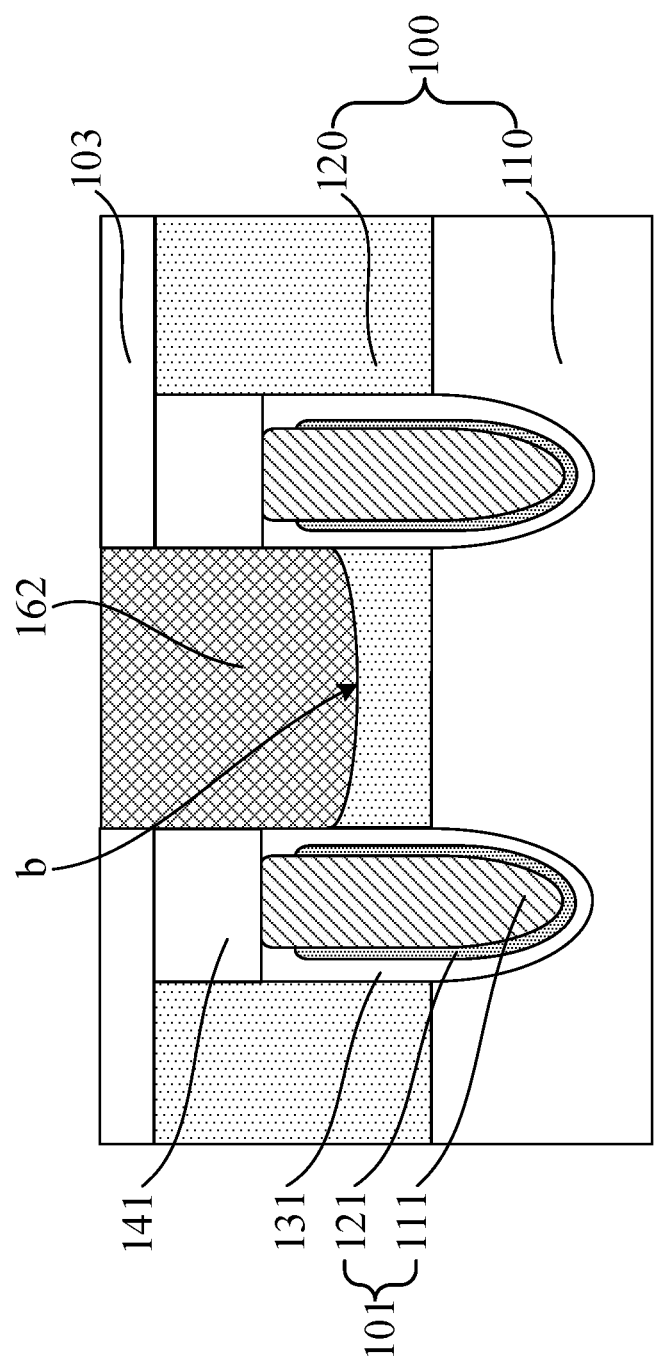

In some embodiments, forming the bit line contact layer 112 may include the following process steps:

Referring to FIG. 20, forming an initial bit line contact layer 162 to fill the trench c (refer to FIG. 19). Herein, when the surface of the substrate 100 has the protective layer 103, the top surface of the initial bit line contact layer 162 away from the substrate 100 is flush with the top surface of the protective layer 103 away from the substrate 100. In other embodiments, when the substrate surface is exposed, the top surface of the initial bit line contact layer away from the substrate may be flush with the substrate surface.

Figure 21:
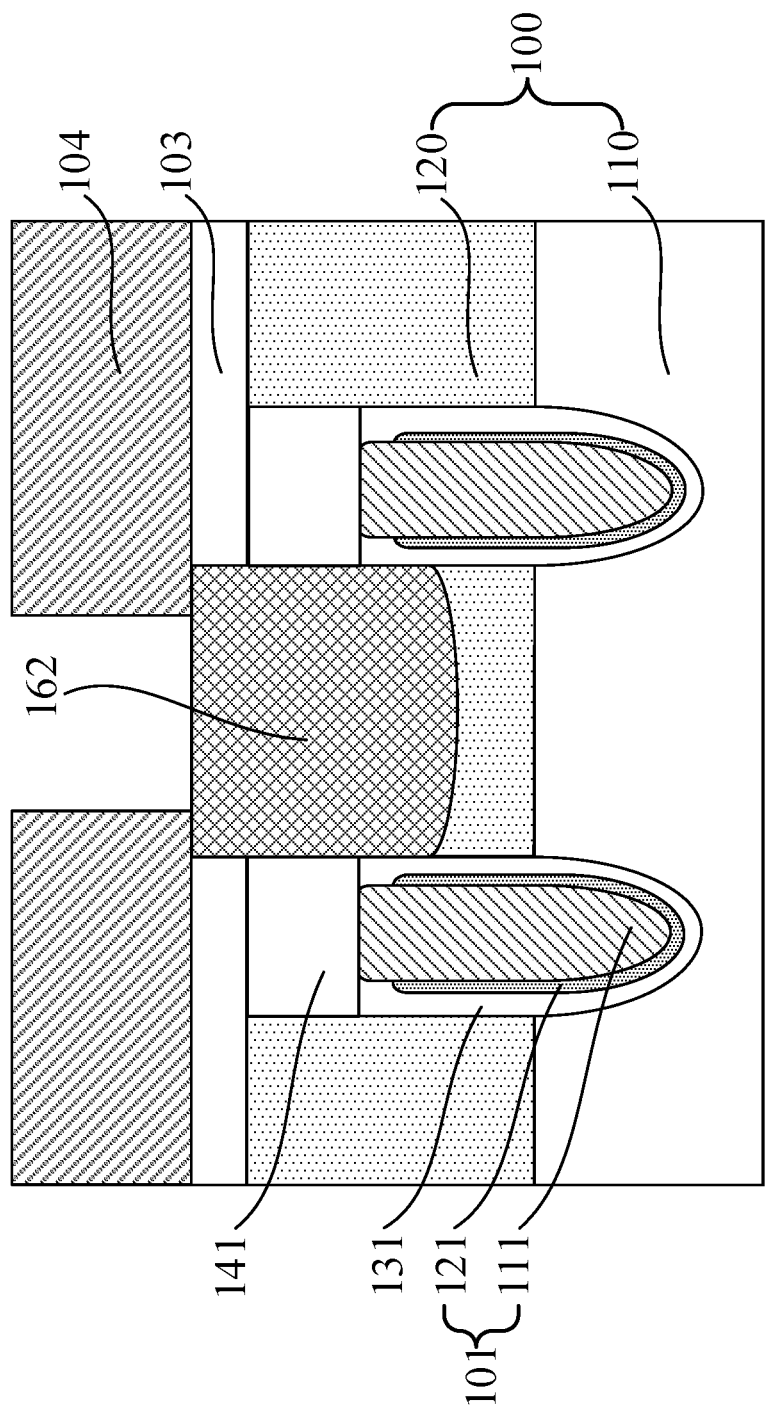

Referring to FIG. 21, a mask layer 104 is formed on the surface of the substrate 100 and the surface of the initial bit line contact layer 162. The mask layer 104 has one or more openings that expose at least part of the surface of the initial bit line contact layer 162. It should be noted that the number of openings in the mask layer 104 may be one, or two, and the embodiment of the present application provides no limits to the orthographic projection of the openings of the mask layer 104 on the substrate 100, and the shape and arrangement of the openings.

The material of the mask layer 104 includes at least one of hard mask materials such as silicon nitride, silicon oxide, or silicon oxynitride, and the method for forming the mask layer 104 includes chemical vapor deposition, physical vapor deposition, or atomic layer deposition, etc.

Figure 22:
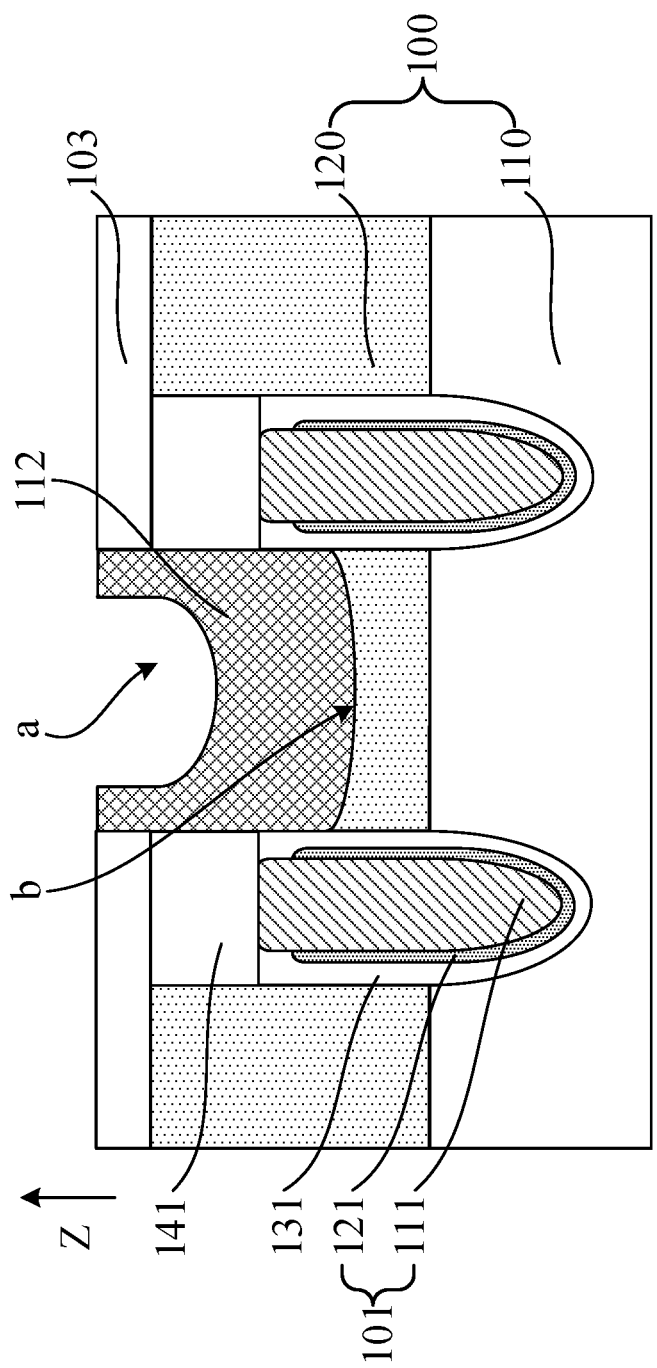

Referring to FIG. 3 and FIG. 21 to FIG. 22 in combination, the initial bit line contact layer 162 is etched by using the mask layer 104 to pattern the bit line contact layer 112, and then the mask layer 104 is removed.

In some embodiments, the non-planar contact portion 132 has a first protrusion 142 and at least one groove a surrounded by the first protrusion 142, and a subsequently formed conductive layer has second protrusion at a position related to the groove a, and the second protrusion is inter-twined in the groove a. In some embodiments, the material of the initial bit line contact layer 162 is polysilicon, the method for etching the initial bit line contact layer 162 includes a dry etching process, and the etching gas includes carbon tetrafluoride and argon.

With the dry etching processing, in the direction Z perpendicular to the surface of the substrate 100, the depth of the groove a gradually increases, and the etching gas first contacts the sidewalls of the groove a, then penetrates deeper to the bottom surface of the groove a contact, so that the probability of the etching gas contacting and reacting with the sidewalls of the groove a is greater than the probability of contacting and reacting with the bottom surface of the groove a, thereby facilitating the formation of the bottom surface of the groove recessed toward the bottom surface b of the groove.

The ratio of the gas flow rate of carbon tetrafluoride to the gas flow rate of argon is 3-6. For example, the ratio of the gas flow rate of carbon tetrafluoride to the gas flow rate of argon gas may be 5, which is beneficial to ensure that the formed bit line contact layer 112 has high dimensional accuracy, and at the same time, the rate of etching the substrate 100 is fast, Therefore, it is beneficial to improve the efficiency of forming the bit line contact layer 112.

In some embodiments, the material of the mask layer 104 is silicon nitride, to remove the silicon nitride, hot phosphoric acid can be used. In other embodiments, the material of the mask layer 104 is silicon oxide, diluted hydrofluoric acid can be used, in a ratio of hydrofluoric acid to water 1:300, for example, to remove silicon oxide.

In addition, in the direction Z perpendicular to the surface of the substrate 100, the depth of the groove a is 3 nm~7 nm. It should be noted that the depth of the groove a refers to the distance between the position where the groove a is closest to the bottom surface b of the trench and the top surface of the bit line contact layer 112 away from the substrate 100. For example, the depth of the groove a maybe 5 nm, so as to ensure that the overall size of the subsequently formed bit line has an appropriate size.

In other embodiments, after the initial bit line contact layer is etched by using the mask layer as a mask to form the initial groove, the initial groove may also be etched again to form a bottom surface with a wavy shape and a stepped bottom surface or other shaped grooves.

In still other examples, after the trenches are formed and before the initial bit line contact layer is formed, the substrate exposed by the trenches may also be processed to form a substrate with a localized region protruding toward the opening of the trenches. For example, a first mask layer is formed on the bottom surface and sidewalls of the trench, and the first mask layer surrounds a through hole; a second mask layer is formed that fills the through hole; the second mask layer is used as a mask to etch the first mask layer to expose a part of the substrate; the part of the substrate is etched, and then the second mask layer is removed to form a substrate with a local area protruding toward the opening of the trench. Wherein, the material of the first mask layer and the material of the second mask layer are different, and the material of the first mask layer and the material of the second mask layer can both be one of silicon nitride, silicon oxide, monocrystalline silicon, polycrystalline silicon, or silicon oxynitride. It should be noted that the above description is only an exemplary illustration of how to form a substrate with a local area protruding toward the groove opening, and the embodiments of the present application do not limit the method for forming a substrate with a local area protruding toward the groove opening.

In FIG. 1 to FIG. 3, a conductive layer 122 is formed, the conductive layer 122 is in contact with the non-planar contact portion 132 of the bit line contact layer 112, the conductive layer 122 has a second protrusion 152 (see FIG. 2) at a position corresponding to the groove a, the second protrusion 152 is intertwined in the groove a.

The material of the conductive layer 122 may be at least one of the metal materials such as tungsten, aluminum, copper or titanium, and the bit line contact layer 112 and the conductive layer 122 are both components of the bit lines 102.

To sum up, forming the bit line contact layer 112 having the first protrusion 142 and the groove a and the conductive layer 122 having the second protrusion 152, herein the second protrusion 152 is intertwined in the groove a. In one aspect, in a plane perpendicular to the direction in which the bit line contact layer 112 points to the conductive layer 122, it is beneficial to increase the contact area between the bit line contact layer 112 and the conductive layer 122, while ensuring that the cross-sectional areas of the bit line contact layer 112 and the conductive layer 122 on the plane being small, thereby reducing the resistance of the bit line 102 itself. In another aspect, the bit line contact layer 112 has a groove a, and the second protrusion 152 of the conductive layer 122 filling the groove a, it is beneficial to reduce the proportion of the bit line contact layer 112 in the bit line 102, thereby helping to improve the overall conductivity of the bit line 102. The above two aspects are beneficial reducing the resistance of the bit line 102 itself, thereby helping to improve the electrical performance of the semiconductor structure, so as to improve the access speed of the semiconductor structure. In addition, the second protrusion 152 is intertwined in the groove a, which is beneficial to improve the stability of the connection between the bit line contact layer 112 and the conductive layer 122.

Those of ordinary skill in the art can understand that the above-mentioned embodiments are specific examples for realizing the present application, and in practical applications, various changes in form and details can be made without departing from the spirit and the scope of the present application. Any person skilled in the art can make respective changes and modifications without departing from the spirit and scope of the present application. Therefore, the protection scope of the present application should be subjected to the scope defined by the claims.

The invention claimed is:

1. A semiconductor structure, comprising:
a substrate, comprising word lines formed at intervals on the substrate, wherein a trench is formed between two adjacent ones of the word lines;
a bit line contact layer, wherein a bottom surface of the bit line contact layer is in contact with a bottom surface of the trench, and wherein the bit line contact layer comprises non-planar contact portions on a top surface away from the bottom surface of the trench; and
a conductive layer, wherein the conductive layer is in contact connection with the non-planar contact portions of the bit line contact layer, wherein
the non-planar contact portions have at least two grooves arranged at intervals, and wherein the depths of the at least two grooves are different in a direction perpendicular to a surface of the substrate.

2. The semiconductor structure of claim 1, wherein
each of the non-planar contact portions of the bit line contact layer comprises one or more first protrusions, wherein at least one groove is surrounded by the one or more first protrusions, wherein the conductive layer comprises a second protrusion at a position corresponding to the groove, wherein the second protrusion is intertwined with the groove, wherein a bottom surface of the conductive layer is higher than a top surface of the word lines, and wherein the conductive layer is in contact connection with at least two non-planar contact portions of the bit line contact layer.

3. The semiconductor structure according to claim 2, wherein
a number of the one or more first protrusions is at least two, and wherein a combined structure of the at least two first protrusions has an orthographic projection on the substrate of an axisymmetric figure.

4. The semiconductor structure of claim 2, wherein
a number of the one or more first protrusions is one, and an orthographic projection of the one first protrusion on the substrate is an axisymmetric figure.

5. The semiconductor structure of claim 4, wherein
the orthographic projection of the one first protrusion on the substrate is a ring or a cross.

6. The semiconductor structure of claim 2, wherein
a bottom surface of the groove comprises at least two regions of different depths in a direction perpendicular to a top surface of the substrate.

7. The semiconductor structure of claim 6, wherein
the bottom surface of the groove is a concave surface recessed toward the substrate.

8. The semiconductor structure according to claim 2, wherein
an orthographic projection of the groove on the substrate is an axisymmetric figure.

9. The semiconductor structure according to claim 2, wherein
the orthographic projection of the groove on the substrate is a ring shape or a cross shape.

10. The semiconductor structure of claim 1, wherein
the bottom surface of the trench has at least two regions with different depths in a direction perpendicular to a top surface of the substrate.

11. The semiconductor structure of claim 1, wherein
the non-planar contact portions are located in the trench, and comprise a convex surface that protrudes away from the bottom surface of the trench.

12. A method for manufacturing a semiconductor structure, comprising:
providing a substrate comprising word lines spaced away from each other;
forming a trench in the substrate between two adjacent word lines;
forming a bit line contact layer, wherein a bottom surface of the bit line contact layer is in contact with a bottom surface of the trench, and wherein the bit line contact layer comprises non-planar contact portions in a direction away from the bottom surface of the trench; and
forming a conductive layer, wherein the conductive layer is in contact with the non-planar contact portions of the bit line contact layer, wherein
forming the bit line contact layer comprises:
forming an initial bit line contact layer filling the trench;
forming a mask layer on a surface of the substrate and a surface of the initial bit line contact layer, forming an opening in the mask layer, wherein the opening exposes at least part of the surface of the initial bit line contact layer;
etching the initial bit line contact layer using the mask layer to form the bit line contact layer having the non-planar contact portions, wherein the non-planar contact portions comprise first protrusions and at least one groove surrounded by the first protrusions; and wherein the conductive layer comprises a second protrusion at a position corresponding to the groove, wherein the second protrusion is embedded in the groove.

13. The method according to claim 12, wherein a material of the initial bit line contact layer is polysilicon, wherein etching the initial bit line contact layer comprises a dry etching process, and wherein etching gases include carbon tetrafluoride and argon.

14. The method according to claim 13, wherein a ratio of a gas flow rate of the carbon tetrafluoride to a gas flow rate of the argon is 3 to 6.

15. The method according to claim 12, wherein a depth of the groove is 3 nm to 7 nm in a direction perpendicular to the surface of the substrate.

* * * * *